(12) United States Patent
Matsuzawa

(10) Patent No.: US 6,551,764 B2
(45) Date of Patent: Apr. 22, 2003

(54) EXPOSURE METHOD

(75) Inventor: Nobuyuki Matsuzawa, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/907,372

(22) Filed: Jul. 17, 2001

(65) Prior Publication Data

US 2002/0068242 A1 Jun. 6, 2002

(30) Foreign Application Priority Data

Jul. 28, 2000 (JP) ........................................ 2000-229731

(51) Int. Cl.$^7$ ................................................. G03C 5/00
(52) U.S. Cl. ................... 430/311; 430/270.1; 430/325; 430/326; 430/907
(58) Field of Search ............................ 430/270.1, 907, 430/311, 325, 326

(56) References Cited

U.S. PATENT DOCUMENTS 6,291,129 B1 * 9/2001 Shida ..................... 430/270.1

FOREIGN PATENT DOCUMENTS

JP 10-298135 * 11/1998

* cited by examiner

*Primary Examiner*—Rosemary Ashton
(74) *Attorney, Agent, or Firm*—Robert J. Depke; Holland & Knight LLC

(57) ABSTRACT

When selectively exposing a resist layer with vacuum ultraviolet rays for patterning into a predetermined shape, the present invention utilizes a polymer material constituting the resist layer and having at least one alicycle which is a saturated n-member ring (n is a number of carbon atoms constituting the ring and is an even number) and a fluorine substitution group in at least two carbon atoms constituting the alicycle and arranged alternately. Thus, by improving the light transmission ratio of the resist layer in the vacuum ultraviolet ray wavelength region, it becomes possible to perform a super-fine processing which cannot be obtained in the conventional method.

7 Claims, 2 Drawing Sheets

EXPOSURE METHOD

RELATED APPLICATION DATA

The present application claims priority to Japanese Application No. P2000-229731 filed Jul. 28, 2000, which application is incorporated herein by reference to the extent permitted by law.

BACKGROUND OF THE INVENTION

1. Field of the Invention

The present invention relates to an exposure method for super-fine processing in the semiconductor field, for example.

2. Description of the Related Art

In the semiconductor field, for example, there is a need to establish a novel process technique enabling super-fine pattern processing of 0.1 μm or below, for example.

For fine pattern processing, the so-called lithography technique is indispensable. That is, a photosensitive resist layer is formed on a substrate and the resist layer is exposed to light for patterning. In order to reduce the exposure light wave length to improve the optical resolution for super-fine processing, conventionally, g-rays or i-rays of mercury lamps and ultraviolet rays of excimer laser of KrF (krypton fluorine: wavelength 248 nm) and ArF (argon fluorine: wavelength 193 nm) have been used industrially. These techniques have been used for elements of design rule 0.13 μm or above because of the restriction of the resolution by the wavelength.

On the other hand, there is an urgent necessity to develop a novel lithography technique capable of preparing elements of design rule 0.1 μm or below. For this, a novel lithography technique using vacuum ultraviolet (VUV) rays of wavelength 170 nm or below has been vigorously developed for further reducing the exposure light source wavelength which has been used in the conventional lithography technique.

More specifically, a lithography technique using $F_2$ (fluorine dimer) excimer laser having a wavelength of 157 nm has been developed to replace the conventional ArF lithography. Furthermore, a lithography technique using $Ar_2$ (argon dimer) excimer laser having a wavelength of 126 nm has been suggested to replace the $F_2$ lithography technique.

By the way, the polymer material constituting the conventional resist layer has an aromatic cycle or an alicyclic group for maintaining the etching resistance. For example, the novolac resin which is a resin for the i-ray lithography and the polyhydroxystyrene resin which is a resin for the KrF lithography both has aromatic cycles. However, the aromatic cycles have a great absorption of 193 nm which is the exposure wavelength of the ArF lithography. For this, the acrylic resin for the ArF lithography has an alicyclic group instead of the aromatic cycle.

However, in the region of the vacuum ultraviolet rays, the aromatic cycle and alicyclic groups have a large optical absorption and accordingly, the polymer material constituting the conventional resist layer containing the aromatic cycle or alicyclic group also shows a large optical absorption. For this, in the conventional resist layer, light used cannot reach the bottom of the resist layer, disabling to prepare a resist pattern having a preferable rectangular shape. Thus, the resist patter is deteriorated.

The deterioration of the resist pattern is a great hindrance for super-fine processing and its improvement is desired. In order to work around this problem, for example, the film thickness of the resist layer is reduced to 70 nm or less, thereby improving the light transmittance in the entire resist layer. However, when the resist layer film thickness is reduced, the arises a problem that the etching resistance becomes insufficient. Furthermore, when the resist layer film thickness is reduced, there also arises a problem that the number of defects in the resist layer is increased.

For these reasons, a study has been made to apply a surface imaging method using a silylation reaction and capable of patterning even when the light transmittance is low. However, when the surface imaging method is applied, there is a problem that an edge portion of the resist pattern is remarkably rough. Furthermore, when the surface imaging method is applied, there is a problem that the dimension control is insufficient.

SUMMARY OF THE INVENTION

It is therefore an object of the present invention to provide an exposure method enabling a super-fine processing by solving the problem of the light transmittance of a resist layer in the region of the vacuum ultraviolet ray wavelength.

In order to achieve the aforementioned object, the present invention provides an exposure method for exposing a resist layer with vacuum ultraviolet rays for patterning into a predetermined shape, wherein a polymer material constituting the resist layer is a polymer material having at least one alicycle which is a saturated n-member ring (n is a number of carbon atoms constituting the ring and is an even number) and a fluorine substitution group in at least two carbon atoms constituting the alicycle and arranged alternately.

Normally, the alicyclic groups have a large absorption in the vacuum ultraviolet ray region and accordingly, the polymer material constituting a resist layer for VUV (vacuum ultraviolet) lithography cannot contain alicyclic groups.

On the other hand, it is known that when the hydrogen atom contained in the alicyclic group is substituted by a fluorine atom, the alicyclic group having the fluorine substitution group has a reduced optical absorption as compared to the one not containing the fluorine substitution group. When considering only lowering the absorption in the vacuum ultraviolet ray region, it is most preferable to substitute all the hydrogen atoms contained in the alicyclic group with fluorine atoms.

However, a polymer material containing a perfluorized alicyclic group tends to remarkably lower the adhesion with a silicon oxide film as the undercoat of the resist film or with an organic or inorganic antireflection film. Moreover, this polymer material has a tendency that as the substitution ratio of the contained hydrogen atoms with fluorine atoms is increased, the etching resistance is deteriorated.

According to the present invention, by substituting particular hydrogen atoms contained in a particular alicycle with fluorine atoms, it is possible to suppress deterioration of the adhesion and the etching resistance as well as to suppress optical absorption of the entire polymer material in the vacuum ultraviolet ray region.

DESCRIPTION OF THE PREFERRED EMBODIMENTS

Figure 1:
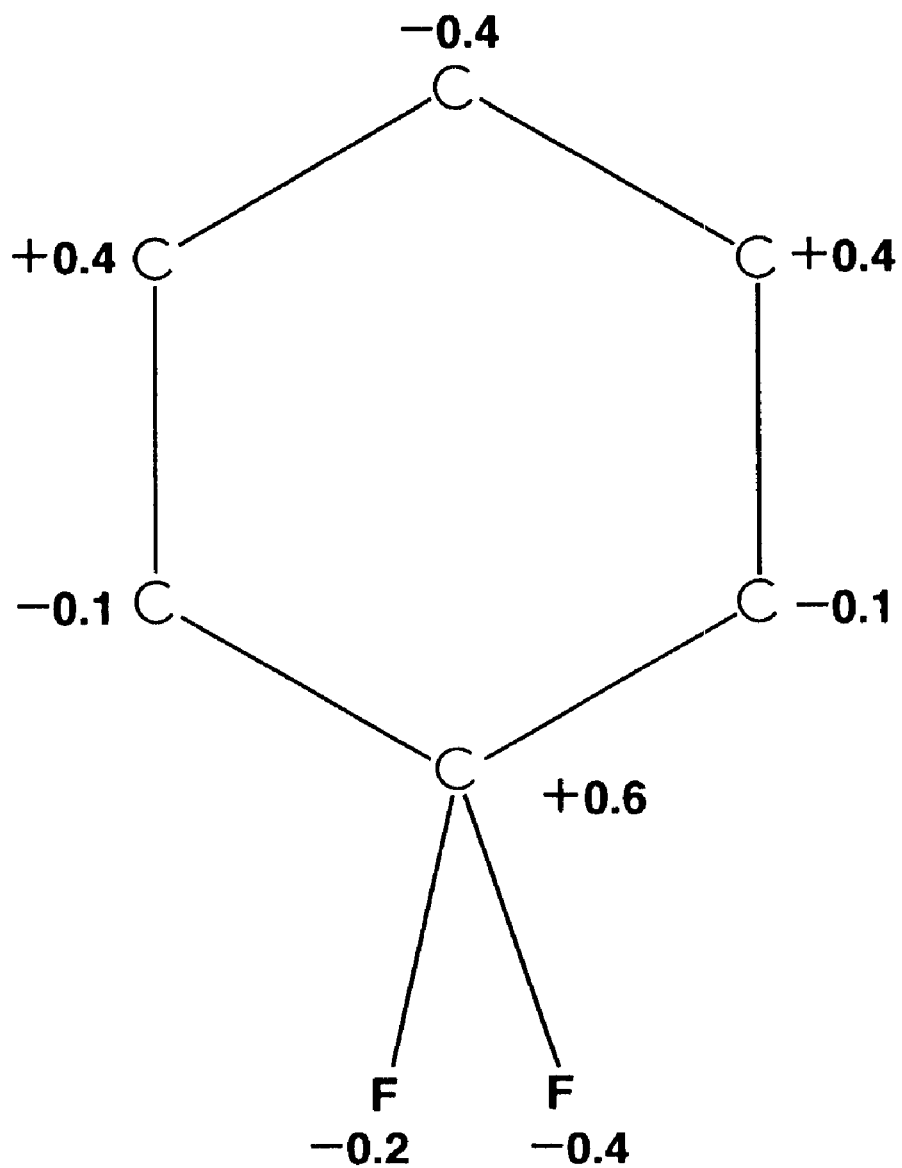
FIG. 1 shows the electron density of 1,1-difluorocyclohexane obtained by a theoretical calculation.

Hereinafter, an exposure method according to the present invention will be detailed.

The exposure method according to the present invention is to be applied to super-fine pattern processing, for example, in semiconductor elements. More specifically, the exposure method includes a step for forming a resist layer having a photosensitive function on a substrate, a step for selectively exposing the resist layer using vacuum ultraviolet rays, and a step for developing the resist layer into a predetermined pattern.

As the vacuum ultraviolet rays for the exposure, vacuum ultraviolet rays of any wavelengths can be used. However, by using vacuum ultraviolet rays having a wavelength in a range from 110 nm to 170 nm, it is possible to perform exposure having an improved resolution. Moreover, as the vacuum ultraviolet rays for the exposure, especially preferable is to use vacuum ultraviolet rays having a wavelength from 120 nm to 165 nm.

For the exposure, for example, fluorine dimer excimer laser is used as a light source and exposure is performed with a wavelength of 157 nm.

Between a resist layer and a substrate formed, for example, from silicon, it is possible to provide an organic or inorganic antireflection film or a hard mask layer formed from silicon or from other than silicon oxide.

The resist layer preferably has a film thickness of 70 nm or above and more preferably 100 nm or above. When the resist layer has a film thickness smaller than 70 nm, the resist layer can be patterned into a predetermined pattern but during etching after the patterning, there is a danger that a preferable etching cannot be performed because of the too thin film thickness. Moreover, when the resist layer has a film thickness smaller than 70 nm, there is a danger that the number of defects in the resist layer may be increased.

The resist layer is formed by using a polymer material having at least one alicycle which is a saturated n-member ring (the number n of carbon atoms constituting the ring is an even number) and a fluorine substituted group constituting an alicycle and introduced to at least two carbon atoms arranged alternately.

Here, the alicycle may be, for example alicycle A shown in Chemical formula 1, alicycle B show in Chemical Formula 2, alicycle C shown in Chemical Formula 3, alicycle D shown in Chemical Formula 4, alicycle E shown in Chemical Formula 5, or alicycle F shown in Chemical Formula 6.

[Chemical Formula 1]

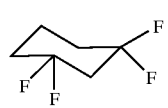

[Chemical Formula 2]

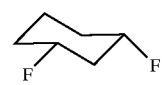

[Chemical Formula 3]

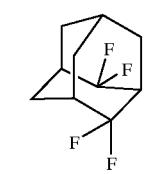

[Chemical Formula 4]

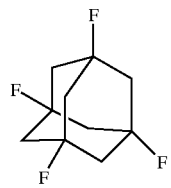

[Chemical Formula 5]

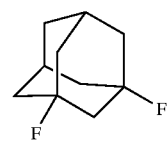

[Chemical Formula 6]

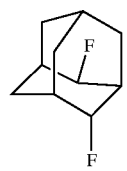

As the polymer material used for the resist layer, there can be exemplified those having as a fundamental skeleton novolac resin containing an alicycle, polyhydroxystyrene resin containing an alicycle, acrylic resin containing an alicycle, siloxane resin containing an alicycle, silsesquioxane resin containing an alicycle, polycycloolefin resin containing an alicycle, and the like.

The alicycles A to F may be contained in the principal chain of the polymer material constituting the resist layer. It should be noted that in Chemical Formula 7 and Chemical Formula 8, $R_1$ is the aforementioned alicycle and $R_2$ and $R_3$ are hydrocarbon groups but may be alicycles. Moreover, in Chemical Formula 7 and in Chemical Formula 8, the pair of parentheses indicates a monomer unit.

[Chemical Formula 7]

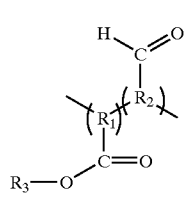

[Chemical Formula 8]

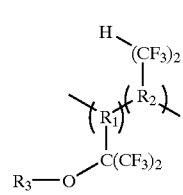

Moreover, the alicycles such as A to F, as shown in Chemical Formula 9 and Chemical Formula 10, may be contained in the side chain of the polymer material constituting the resist layer. It should be noted that in Chemical Formula 9 and Chemical Formula 10, $R_4$ is the aforementioned alicycle and $R_5$ is a hydrocarbon group. Moreover, $R_6$ to $R_{14}$ are hydrocarbon groups or their derivatives or fluorine atoms or hydrogen atoms but $R_6$ to $R_{14}$ may be entirely identical groups or partially or entirely different groups. Furthermore, in Chemical Formula 9 and Chemical Formula 10, the pair of parentheses indicates a monomer unit.

[Chemical Formula 9]

[Chemical Formula 10]

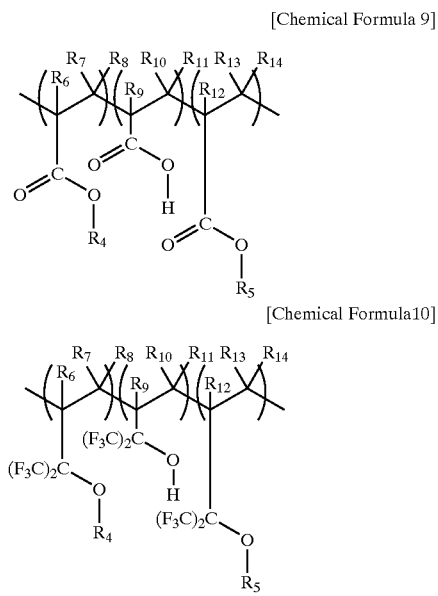

The resist layer may be formed from only the polymer material containing these alicycles. Moreover, the resist layer may contain various additives such as a photoacid generator for improving the exposure sensitivity, a dissolution inhibitor for improving the development characteristic, and a bridging agent for improving the resolution characteristic. It is possible to add one of these or all of them.

The amount of these additives is not limited to particular amounts but they are preferably in the range for obtaining the absorption coefficient of 5.0 $\mu m^{-1}$ in the vacuum ultraviolet wavelength region of the entire resist layer. However, it is preferable that the amount of the additives be 25 wt % or below against the polymer material used for the resist layer. When the content of the additives used for the resist layer exceed 25 wt % against the polymer material used for the resist layer, there is a danger that the resolution characteristic of the entire resist layer may be lowered.

The polymer material containing an alicycle may contain an ester group, phenol group, alcohol group, carboxyl group, fluorinated ester group, fluorinated phenol group, fluorinated alcohol group, fluorinated carboxyl group, and the like or a group having these derivatives for causing a certain chemical reaction by emitted light so as to change the material properties between an irradiated portion and a non-irradiated portion, thereby generating the resist characteristic. Moreover, when the polymer material does not contain these groups causing the resist characteristic, it is possible to obtain the resolution performance utilizing a chemical reaction of the alicycle itself by light irradiation or a chemical reaction utilizing the light irradiation in the principal skeleton of the polymer material.

It should be noted that in this alicycle, a hydrogen atom is substituted by a fluorine and the fluorine substitution group is introduced to at least two carbon atoms arranged alternately. However, hydrogen atoms not substituted by fluorine atoms may be substituted by, for example, an alkyl group, a halogen atom other than fluorine atom, amino group, nitro group, and the like if the absorption coefficient of the entire resist layer in the vacuum ultraviolet wavelength region is 5.0 $\mu m^{-1}$ or below.

Hereinafter, an explanation will be given on the reason why the alicycle according to the present invention has a higher transparency as compared to the alicycles to which the present invention is not applied using a case when the alicycle is cyclohexane, i.e., a fluorine substitute of the cyclohexane. It should be noted that the alicycle according to the present invention will be explained through an example of 1,1,3,3-tetrafluorocyclohexane and the alicycle not based on the present invention but having a fluorine substitute group will be explained through an example of 1,1,2,2,-tetrafluorocyclohexane.

For each of the aforementioned two molecules, the energy was calculated by theoretical calculation. It should be noted that for reference, the charge density of 1,1-difluorocyclohexane was also theoretically calculated.

Firstly, by applying the ab initio molecular orbital method, structural optimization was performed for each of the molecules to obtain the optimal structures. It should be noted that as the ab initio molecular orbital method, the Hartree-Fock method was used, and as the basis function required for the calculation, the 6-31G*basis function was used (referencing P. C. Hariharan, J. A. Pople, Theoret. Chim. Acta, 28, 1973, 213 and M. M. Francl, W. J. Petro, W. J. Hehre, J. S. Binkley, M. S. Gordon, D. J. DeFree, J. A. Pople, J. Phys. Chem., 77, 1982, 3654).

By using the optimal structure thus obtained and applying the density functional which is one of the ab initio molecular orbital method, a potential density and other theoretical calculations were performed. For the density functional method, the correlation potential of Vosko-Wilk-Nusair was applied (referencing S. H. Vosko, L. Wilk, M. Nusair, Can. J. Phys., 58, 1980, 1200). Moreover, the basis function used the DZ basis function (referencing T. H. Dunning Jr., J. Chem. Phys., 53, 1970, 2823) added to the Rydberg basis function (referencing T. H. Dunning Jr., P. J. Harrison, In Modern Theoretical Chemistry, Vol. 2, Ed. H. F. Schaefer III, Plenum Press, New York, 1977).

It should be noted that the Hartree-Fock method calculation and the density functional method calculation were performed by using the program Gaussian 98 (Gaussian 98, Revision A.7, M. J. Frisch, G. W. Trucks, H. B. Schlegel, G. E. Scuseria, M. A. Robb, J. R. Cheeseman, V. G. Zakrzewski, J. A. Montgomery Jr., R. E. Stratmann, J. C. Burant, S. Dappich, J. M. Millam, A. D. Daniels, K. N. Kudin, M. C. Strain, O. Farkas, J. Tomasi, V. Barone, M. Cossi, R. Cammi, B. Mennucci, C. Pomelli, C. Adamo, S. Clifford, J. Ochterski, G. A. Petersson, P. Y. Ayala, Q. Cui, K. Morokuma, D. K. Malick, A. D. Rabuck, K. Raghavachari, J. B. Foresman, J. Cioslowski, J. V. Ortiz, A. G. Baboul, B. B. Stefanov, G. Liu, A. Liashenko, P. Piskorz, I. Komaromi, R. Gomperts, R. L. Marin, D. J. Fox, T. Keith, M. A. AlLaham, C. Y. Peng, A. Nanayakkara, C. Gonzalez, M. Challacombe, P. M. W. Gill, B. Johnson, W. Chem, M. W. Wong, J. L. Andres, C. Gonzalez, M. Head-Gordon, E. S. Replogle, J. A. Pople, Gaussian, Inc., Pittsburgh, Pa., 1988). It should be noted that the computer used was a workstation (COMTEC Octane workstation) produced by Daikin Industries, Ltd.

Here, FIG. 1 shows the electron density of the 1,1-difluorocyclohexane obtained by the theoretical calculation. It should be noted that the numeric values shown in the figure are Atomic Charge. The atomic charge of the carbon atom bonded to the hydrogen atom is the sum of the atomic charge of the hydrogen atoms bonded to the atomic charge of the carbon atoms (accordingly, the figure does not show the atomic charge of the hydrogen atoms). Moreover, since the atomic charges are rounded in the figure, the total of the all the atomic charges are not necessarily zero.

As shown in FIG. 1, the 1,1-difluorocyclohexane is an alicyclic compound having carbocycle constituting of 6, i.e., even number of carbon atoms. In the 1,1-difluorocyclohexane, when a particular one of the carbon atoms is substituted by fluorine, the fluorine atom has a high electronegative characteristic and tends to be charged negatively and accordingly, the carbon atom bonded to the fluorine atom is positively charged. Furthermore, in the other carbon atoms, the ones bonded to the fluorine atoms are positively charged and accordingly, they are charged alternately positively and negatively. This phenomenon is a well known phenomenon in the aromatic cycle and a similar phenomenon can also be seen in the saturated hydrocarbon in which carbon atoms are bonded one another only by the a bonding and not by the π bonding.

Here, the 1,1,3,3-tetrafluorocyclohexane and the 1,1,2,2-tetrafluorocyclohexane as compounds obtained by fluoridation of a particular carbon atom in the 1,1-difluorocyclohexane are compared to each other as follows. The 1,1,3,3-tetrafluorocyclohexane obtained by fluoridation of the third carbon atom which is positively charged with a larger value than the other carbon atoms in the 1,1-difluorocyclohexane can be expected to be a stable molecule as a whole than the 1,1,2,2-tetrafluorocyclohexane obtained by fluoridation of the second carbon atom in the 1,1-difluorocyclohexane.

Actually, the calculation result of the molecule energy by the density functional method shows that the 1,1,3,3-tetrafluorocyclohexane is more stable than the 1,1,2,2,-tetrafluorocyclohexane by about 7.5 kcal/mol.

When the molecule is more stable, the HOMO (Highest Occupied Molecular Orbital) order of the molecule tends to be more stable. When the HOMO order becomes more stable, relatively, the gap between the HOMO order and the LUMO (Lowest Unoccupied Molecular Orbital) order is increased and the absorption end of the molecule is shifted to the higher energy side. That is, when the wavelength is fixed, the molecule becomes more transparent.

Figure 2:
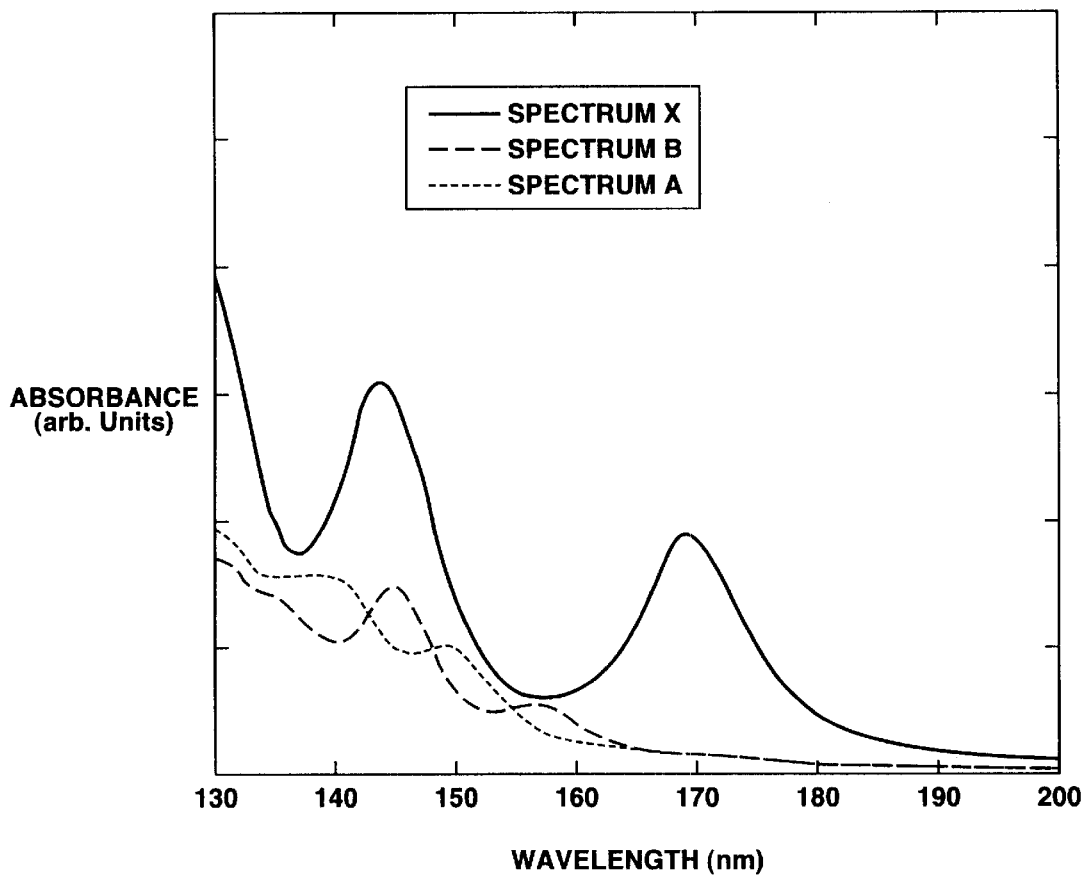
FIG. 2 shows absorption spectra of cyclohexane and its substitution by fluorine in the vacuum ultraviolet ray region calculated by using the density functional method.

FIG. 2 shows the calculation result of the absorption spectra of the 1,1,3,3-tetrafluorocyclohexane and the 1,1,2,2-tetrafluorocyclohexane in the region of the vacuum ultraviolet rays by using the density functional method. Moreover, FIG. 2 also shows the absorption spectrum of the cyclohexane.

It should be noted that in FIG. 2, the vertical axis represents the absorbance and the horizontal axis represents the wavelength (unit: nm). Moreover, in FIG. 2, the absorption spectrum of the 1,1,3,3-tetrafluorocyclohexane is indicated by spectrum A, the absorption spectrum of the 1,1,2,2-tetrafluorocyclohexane is indicated by spectrum B, and the absorption spectrum of the cyclohexane is indicated by spectrum X.

Moreover, the calculation method of the absorption spectrum is identical to the calculation of the charge density and the energy by using the density functional method. However, in addition to the aforementioned density functional method, the theory of time dependent density functional method was applied (referencing R. Bauernschmitt, R. Ahlrichs, Chem. Phys. Lett., 256, 1996, 454 and M. E. Casida, C. Jamorski, K. C. Casida, D. R. salahub, J. Chem. Phys., 108, 1998, 4439).

As is clear from FIG. 2, the absorption peak of the 1,1,3,3-tetrafluorocyclohexane, when compared to that of the 1,1,2,2-tetrafluorocyclohexane, is shifted to a higher energy side, thereby reducing the light absorption in the region of the vacuum ultraviolet rays.

EXAMPLE

Hereinafter, explanation will be given on specific examples according to the present invention.

The inventors of the present invention actually measured the absorption spectra of the aforementioned 1,1,3,3-tetrafluorocyclohexane and the 1,1,2,2-tetrafluorocyclohexane in the vacuum ultraviolet wavelength region.

The measurement apparatus of the absorption spectrum was prepared by ourselves. As the exposure light source, a deuterium lamp (30W) was used, and as the light source optical system, an $MgF_2$ lens was used. As for the spectroscope portion, a concave diffraction grating of 1200 lines/mm ($MgF_2$ coating) was used. The inverse dispersion was about 4 nm and the wavelength measurement range was from 125 nm to 300 nm.

Moreover, the sample chamber portion in vacuum was in the form for measuring semi double beam and a gas cell having an $MgF_2$ window was established. Into this gas cell, the sample molecule gas controlled in temperature and pressure was introduced for measurement. As the light collecting mirror, a toroidal mirror was used. The sample chamber pressure was set to $4 \times 10^{-5}$ Torr. It should be noted that the detector used was the 6199 type photomultiplier tube produced by JASCO Corporation.

Table 1 shows the absorbance of the 1,1,3,3-tetrafluorocyclohexane and 1,1,2,2-tetrafluorocyclohexane having a wavelength of 157 nm as the aforementioned measurement results. It should be noted that this absorbance is a relative value when the absorbance of the 1,1,2,2-tetrafluorocyclohexane is assumed to be 1.

TABLE 1

| Substitution group | Absorbance |
|---|---|
| 1,1,2,2-tetrafluorocyclohexane | 1 |
| 1,1,3,3-tetrafluorocyclohexane | 0.6 |

As is clear from Table 1, the 1,1,3,3-tetrafluorocyclohexane according to the present invention shows a lowered absorbance as compared to the 1,1,2,2-tetrafluorocyclohexane not according to the present invention but containing a fluorine substitution group.

As has been described above, according to the present invention, by substituting the hydrogen atom contained in the alicycle by a fluorine atom, it is possible to effectively lower the optical absorption in the vacuum ultraviolet ray region. That is, when the polymer material constituting the resist layer contains the alicycle according to the present invention, it is possible to obtain a material having a high transparency and suppressing the adhesion and etching resistance deterioration.

It should be noted that in the aforementioned Example, explanation was given on a case of cyclohexane whose fluorine substitute was an alicycle. However, the present invention is not to be limited to this and can also be applied to, for example, adamantane and other alicycles.

What is claimed is:

1. An exposure method for exposing a resist layer with vacuum ultraviolet rays for patterning into a predetermined shape, applying a resist layer comprised of a polymer material to a semiconductor device layer, wherein the polymer material of the resist layer is a polymer material having at least one alicycle which is a saturated n-member ring (where n is a number of carbon atoms constituting the ring and is an even number) at least two carbon atoms constituting the alicycle which are arranged alternately have a fluorine substitution group bonded thereto; and selectively applying vacuum ultraviolet rays to the resist layer.

2. The exposure method as claimed in claim 1, wherein the alicycle is contained in a principal chain of the polymer material constituting the resist layer.

3. The exposure method as claimed in claim 1, wherein the alicycle is contained in a side chain of the polymer material constituting the resist layer.

4. The exposure method as claimed in claim 1, wherein the polymer material constituting the resist layer has an absorption coefficient 5.0 $\mu m^{-1}$ or below in the vacuum ultraviolet ray wavelength region.

5. The exposure method as claimed in claim 1, wherein the vacuum ultraviolet ray has a wavelength in a range from 110 nm to 170 nm.

6. The exposure method as claimed in claim 1, wherein the vacuum ultraviolet ray is emitted from a light source which is a fluorine dimer excimer laser.

7. A method for exposing a resist layer with vacuum ultraviolet rays for patterning into a predetermined shape, comprising the steps of:

applying a resist layer comprised of a polymer material to a semiconductor device layer, wherein the polymer material of the resist layer is a polymer material having at least one alicycle which is a saturated n-member ring (where n is a number of carbon atoms constituting the ring and is an even number) and at least two alternately arranged carbon atoms constituting the alicycle each has at least one fluorine atom bonded thereto; and selectively applying vacuum ultraviolet rays to the resist layer.

* * * * *